United States Patent [19]

Stein

[11] 4,222,095
[45] Sep. 9, 1980

[54] FREQUENCY TO VOLTAGE CONVERTER

[75] Inventor: Marc T. Stein, Tempe, Ariz.

[73] Assignee: Motorola, Inc., Schaumburg, Ill.

[21] Appl. No.: 967,828

[22] Filed: Dec. 8, 1978

[51] Int. Cl.$^3$ ............................................. G01R 23/06
[52] U.S. Cl. ........................................ 363/8; 328/140; 324/78 E; 307/261
[58] Field of Search .................................... 363/8, 157; 328/140-141; 324/78 E, 78 J; 307/233 A, 261, 271

[56] References Cited

U.S. PATENT DOCUMENTS

| | | | |
|---|---|---|---|
| 3,569,737 | 3/1971 | Bauer | 328/140 X |
| 3,575,611 | 4/1971 | Reed | 328/140 X |
| 3,609,395 | 9/1971 | Jania | 324/78 E |
| 3,656,000 | 4/1972 | Neathery, Jr. | 324/78 E |
| 3,796,942 | 3/1974 | Bynum | 328/140 X |
| 3,992,660 | 11/1976 | Kawashima et al. | 363/8 |
| 4,085,373 | 4/1978 | McConnell | 307/233 A |

*Primary Examiner*—J. D. Miller
*Assistant Examiner*—Peter S. Wong
*Attorney, Agent, or Firm*—Michael D. Bingham

[57] ABSTRACT

A circuit is disclosed which is responsive to an applied alternating input signal for producing an analog output signal the magnitude of which is made proportional to the frequency of the input signal. A triggering circuit is provided which produces a triggering signal on positive transitions of the input signal. A circuit is included for producing a dual ramp output voltage the peak magnitude of which is varied in accordance with the frequency of the applied input signal. A peak detector circuit samples the dual ramp voltage and holds this value until the next cycle of the input signal wherein the dual ramp voltage is again sampled. The triggering circuit also includes a comparison amplifier for providing control signals the state of which are representative of the respective magnitudes of the dual ramp and peak voltages. These control signals are utilized in conjunction with said triggering signals to vary the peak magnitude of the dual ramp voltage in accordance with variations in the frequency of the input signal.

4 Claims, 3 Drawing Figures

FREQUENCY TO VOLTAGE CONVERTER

CROSS REFERENCE TO RELATED APPLICATIONS

The subject matter of the subject invention is related to the subject matter of the following applications, all of which are filed concurrently herewith: "High Impedance Output Current Source", Ser. No. 967,823; "Comparision Circuit Having Bidirectional Hysteresis", Ser. No. 967,826; "Switching Circuit Having Hysteresis" Ser. No. 967,825; and "Unity Gain Amplifier for Sourcing Current to a Capacitive Load or the Like", Ser. No. 967,824; by Marc T. Stein all of which are assigned to Motorola, Inc.

BACKGROUND OF THE INVENTION

This invention relates to voltage converter circuits and more particularly to a frequency to voltage converter circuit suitable to be fabricated in monolithic integrated circuit form to provide an analog output voltage the magnitude of which is representative of the frequency of an input signal applied thereto.

In control circuits, a control voltage proportional to the frequency of an input signal may be required. For example, a particular control system which can be contemplated is a fuel metering system for use in tomorrows automobiles. The fuel metering system would be responsive to engine speed for adjusting the fuel to air mixture ratio which is injected into the cylinders of the automobile for engine combustion. In such a system a signal having a frequency corresponding to the engine speed can be developed from which analog voltages are produced. These analog voltages may then be used to vary the air/fuel mixture ratio to ensure proper engine operation.

It is important that the frequency to voltage converter utilized in such fuel metering systems be responsive to instantaneous changes in engine rpm due to acceleration and deceleration of the automobile. Hence, the output analog voltage of the converter system should be made to be responsive to engine speed variations within one cycle of the frequency change in the applied input signal to the converter. However, typical capacitive charging and discharging systems used in the past to convert frequency signals to voltage related signals have often had too lengthly response times so as to be operable in fuel metering systems. Therefore, a need exists to provide a frequency to voltage converter having fast response times to changes in the frequency of an applied input signal such as to be suitable to be incorporated into a fuel metering system if desired.

SUMMARY OF THE INVENTION

Accordingly, an object of the present invention is to provide an improved frequency to voltage converter.

Another object of the present invention is to provide an improved frequency to voltage converter suitable to be manufactured in monolithic integrated circuit form.

Still another object of the present invention is to provide a frequency to voltage converter for use in fuel metering systems.

In accordance with the foregoing and other objects there is provided a frequency to voltage converter for producing an output analog voltage which is proportional to the frequency of an applied alternating input signal. The frequency to voltage converter includes a first circuit which generates an output signal which is controllable in a predetermined manner and a peak detector circuit which receives the output signal from the first circuit to produce the output analog voltage. The magnitude of the output analog voltage is representative of the peak magnitude of the output signal produced from the first circuit. A second circuit is provided which receives the alternating input signal and is coupled to the first circuit for controlling the magnitude of the output signal from the first circuit in accordance with the frequency of the applied alternating signal. The frequency to voltage converter of the present invention provides one cycle adjustment for increases and decreases in the frequency of the applied input signal.

DETAILED DESCRIPTION OF THE INVENTION

Figure 1:
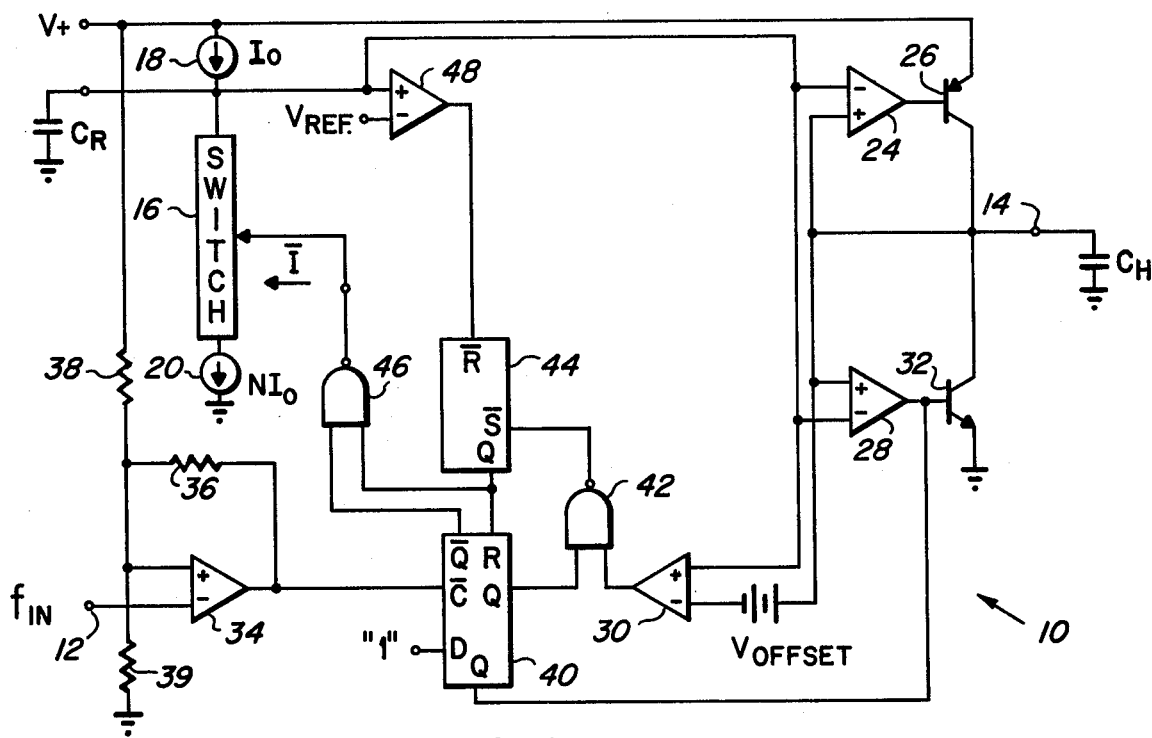
FIG. 1 is a simplified, partial schematic in block diagram of the embodiment of the invention.

There is illustrated in FIG. 1 frequency to voltage converter 10 of the present invention. As shown, converter 10 can be fabricated in monolithic integrated circuit form utilizing a combination of both bipolar and integrated injection logic (I$^2$L) technologies. Hence, wherever a logic function is indicated I$^2$L circuit technology is utilized, otherwise the circuitry of converter 10 utilizes linear bipolar integrated circuit technology. Additionally, the I$^2$L circuits utilized open collector output logic with a current source in the input.

Figure 2:
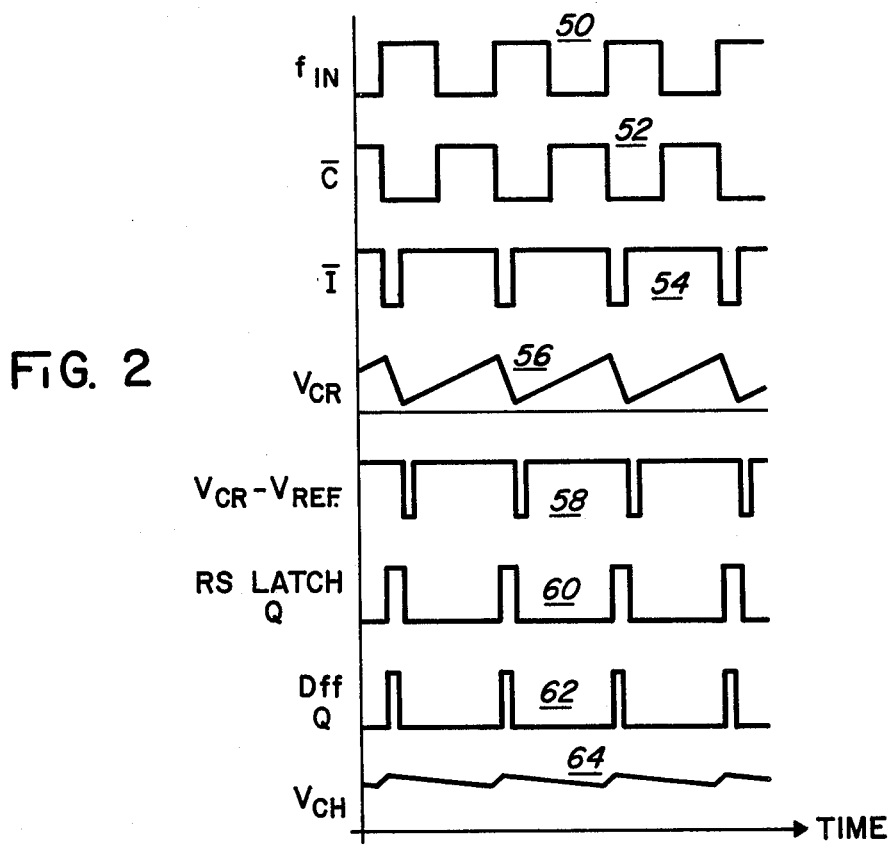
FIG. 2 is a waveform diagram useful for understanding the function of the embodiment of the invention.

Broadly, in response to receiving an alternating input signal $f_{IN}$ at input terminal 12, which in the preferred embodiment is shown in FIG. 2 (waveform 50) as being a square wave, an analog voltage is produced across holding capacitor $C_H$. This voltage appears at output terminal 14 of converter circuit 10. The magnitude of the analog output signal $V_{CH}$ is varied proportionately with changes in the frequency of input signal $f_{IN}$. More particularly, a first circuit comprising switch 16 and current sources 18 and 20 produces a dual slope voltage output across capacitor $C_R$, at terminal 22, the peak magnitude of which is varied in accordance with changes in the frequency of input signal $f_{IN}$. Specifically, capacitor $C_R$ is charged at rate proportionate to $I_O$ with switch 16 open and with switch 16 closed is discharged at a rate proportional to $(N-1) I_O$ (waveform 56 of FIG. 2). In the preferred embodiment of the invention N equals the numeric value 8 such that capacitor $C_R$ is charged by a current $I_O$ and discharged by a current equal to $7I_O$.

The voltage $V_{CR}$ which appears across capacitor $C_R$ is applied to the negative input of operational amplifier 24. The positive input of this op amp is coupled to capacitor $C_H$ at output terminal 14. The output of op amp 24 is coupled to the base of PNP transistor 26, the collector thereof being coupled to capacitor $C_H$ via terminal 14. The emitter of transistor 26 is returned to a source of operating potential V+. As long as the magnitude of $V_{CH}$ is greater than the peak magnitude of $V_{CR}$ transistor 26 is nonconductive. However if the peak magnitude of $V_{CR}$ is greater than $V_{CH}$ transistor 26 is rendered conductive to charge capacitor $C_H$ thereby increasing $V_{CH}$ to a value substantially equal to the new peak magnitude of $V_{CR}$. Conversely, when the peak magnitude of $V_{CR}$ is decreased capacitor $C_H$ is discharged by the action of operational amplifiers 28 and 30 and transistor 32 to within a predetermined value of $V_{CR}$ as will be more fully explained hereinafter. Thus, if the peak magnitude of $V_{CR}$ is caused to be varied proportionately to the frequency of $f_{IN}$, an analog voltage $V_{CH}$ is obtained which is representative of this frequency. The peak magnitude of $V_{CR}$ is caused to be varied by varying the amount of time that switch 12 is open and closed thereby controlling the charging and discharging of capacitor $C_R$ respectively.

The following discussion assumes that the frequency of $f_{IN}$ is in a steady state condition and is constant. Operational amplifier 34 has its output returned via resistor 36 to its positive input which is also coupled via resistor 38 to the source of operating potential V+ and through resistor 39 to a ground reference potential. The combination of operational amplifier 34 in combination with the foregoing resistors provides a comparator function having hysteresis such that on each positive going edge of $f_{IN}$ a clock signal is applied to the $\overline{C}$ input of D flip-flop 40. As shown by waveforms 52 and 62, the negative transition of clocking signal 52, with a logic "1" applied to the D input of flip-flop 40, causes the Q output of the flip-flop to go to a high logic state. Therefore a logic "1" is applied to one input of NAND gate 42 the output of which is coupled to the $\overline{S}$ of RS flip-flop 44. If the magnitude of $V_{CH}$ is less than the value, $V_{CR}+V_{OFFSET}$, the output of operational amplifier 30 will also be at a high logic state. Since the output of operational amplifier 30 is coupled to the second input of NAND gate 42, the output thereof is forced low whenever the Q output of flip-flop 40 is high and the value of $V_{CH}$ is either equal to or less than $V_{CR}$. Hence, the forcing of the output of NAND gate 42 low causes the Q output of RS flip-flop 44 to go high. With the Q output of RS flip-flop 44 high, flip-flop 40 is reset such that the $\overline{Q}$ output thereof is forced high. In this state, both inputs to NAND gate 46 are at a high input which forces the output thereof to go to a low state. With the output of NAND gate 46 in a low state, $\overline{I}$ (waveform 54) goes low which causes switch 16 to be closed and capacitor $C_R$ to be discharged. Capacitor $C_R$ is discharged until the magnitude of $V_{CR}$ becomes less than the value of $V_{REF}$ which is applied to the negative input terminal of comparator 48. This then causes the output of comparator 48 to go low resetting flip-flop 44. Hence, with capacitor $C_R$ being discharged below $V_{REF}$ the Q output of flip-flop 44 is reset to a low state forcing $\overline{I}$ to go high. $\overline{I}$ going high causes switch 16 to be open charging capacitor $C_R$ by current source 18. As previously discussed, op amp 24 and transistor 26 which operate as a peak detector circuit charges capacitor $C_H$ only if the peak magnitude to which the voltage across capacitor $C_R$ is charged to reaches a value greater than the voltage maintained across capacitor $C_H$. Hence, if the input signal $f_{IN}$ remains at a constant frequency, the peak magnitude of the voltage $V_{CR}$ will not become greater than the voltage maintained across holding capacitor $C_H$. However, if the frequency of input signal $f_{IN}$ changes whereby the peak magnitude of $V_{CR}$ changes, the peak detector circuit causes the voltage across capacitor $C_H$ to be varied by either charging or discharging the same as will be described more fully hereinbelow.

When the positive edge of the input signal $f_{IN}$ clocks the Q output of flip-flop 40 high, transistor 32 may be rendered conductive to discharge capacitor $C_H$. Thus, if the magnitude of $V_{CH}$ is greater than the magnitude of $V_{CR}$, transistor 32 is gated on or maintained in a conductive state by the Q output of flip-flop 40 being high to discharge capacitor $C_H$. However, if $V_{CH}$ is less than $V_{CR}$ the low output state from op amp 28 prohibits transistor 32 from being rendered conductive when the Q output of flip-flop 40 is clocked high. Furthermore, as long as the voltage $V_{CR}$ is equal to or greater than the magnitude of the voltage $V_{CH}$ minus the offset voltage $V_{OFFSET}$ the output of amplifier 30 will be high and D flip-flop 40 is reset through NAND gate 42 and RS flip-flop 44. Therefore, in a steady state condition, with the frequency of the input voltage $f_{IN}$ constant, the magnitude of $V_{CH}$ is maintained substantially constant. The magnitude of $V_{CH}$ is determined by the peak magnitude to which capacitor $C_R$ is charged as will now be explained hereinbelow.

In the steady state condition, if it is assumed that the magnitude of $V_{CH}$ is equal to or greater than the value of $V_{OFFSET}$ plus the magnitude of $V_{CR}$, the output of operational amplifier 30 will be low or at a logic "0". In this condition, when the Q output of flip-flop 40 is clocked high by the positive transition of $f_{IN}$, transistor 32 is gated on to discharge capacitor $C_H$ through amplifier 28. Capacitor $C_H$ will be discharged until the magnitude of $V_{CH}$ becomes substantially equal to $V_{CR}+V_{OFFSET}$. When this occurs the output of operational amplifier 30 is then gated high which causes reset of flip-flop 40. The resetting of flip-flop 40 turns transistor 32 off to end discharging of capacitor $C_H$. With the output of amplifier 30 high, when input signal $f_{IN}$ goes positive the other input to NAND gate 42 is clocked high which forces the $\overline{S}$ input of RS flip-flop 44 low. This causes the Q output of flip-flop 44 to go high which resets D flip-flop 40 forcing the $\overline{Q}$ output thereof to go high. In this state the two inputs to gate 46 are both in a high logic state which forces the output $\overline{I}$ low. This condition closes switch 16 discharging capacitor $C_R$ at a rate proportional to $(N-1)I_O$ (waveform 56). Capacitor $C_R$ discharges until the magnitude of voltage of thereacross discharges below $V_{REF}$. When $V_{CR}$ becomes less than $V_{REF}$ the output of amplifier 48 goes low resetting RS flip-flop 44 forcing switch 16 open. Thereafter, capacitor $C_R$ is then allowed to charge at the rate proportional to the current $I_O$. Hence, capacitor $C_R$ is charged and discharged in a steady state condition such that at each positive edge of the input signal $f_{IN}$ the peak magnitude $V_{CR}$ is at a steady state level. Hence, if the magnitude of $V_{CH}$ is held substantially constant throughout the period of the input signal, the output of amplifier 24 remains low and capacitor $C_H$ is not charged. Thus, in this steady state condition the magnitude of voltage developed across capacitor $C_H$ is also held constant which indicates no change in the frequency of the input signal.

A novel feature of the present invention is that converter 10 provides one cycle adjustment for increases in the frequency of the input signal $f_{IN}$. Thus, if the frequency of input signal $f_{IN}$ increases from a steady state condition, the magnitude of $V_{CH}$ will be significantly greater than the magnitude of the voltage $V_{CR}$ on the positive going edge of $F_{IN}$. In this state, as the Q output of D flip-flop 40 is clocked high, transistor 32 is rendered conductive to discharge capacitor $C_H$ to the new value of the voltage $V_{CR}$ appearing across capacitor $C_R$. Capacitor $C_H$ is discharged until it is within the value of $V_{CR}$ which causes the output of amplifier 30 to go high. This, in conjunction with Q output of flip-flop 40 being in a high state, forces the output of gate 42 to go low. With the output of NAND gate 42 being low, the previously described operation of frequency to converter circuit 10 commences and capacitor $C_R$ is caused to be discharged and charged to the new peak value representative of the new frequency of input signal $f_{IN}$. Conversely, if the frequency of the input signal $f_{IN}$ decreases, capacitor $C_R$ will be allowed to charge to a higher peak magnitude in the next cycle such that capacitor $C_H$ is charged through the collector emitter path of transistor 26.

Figure 3:
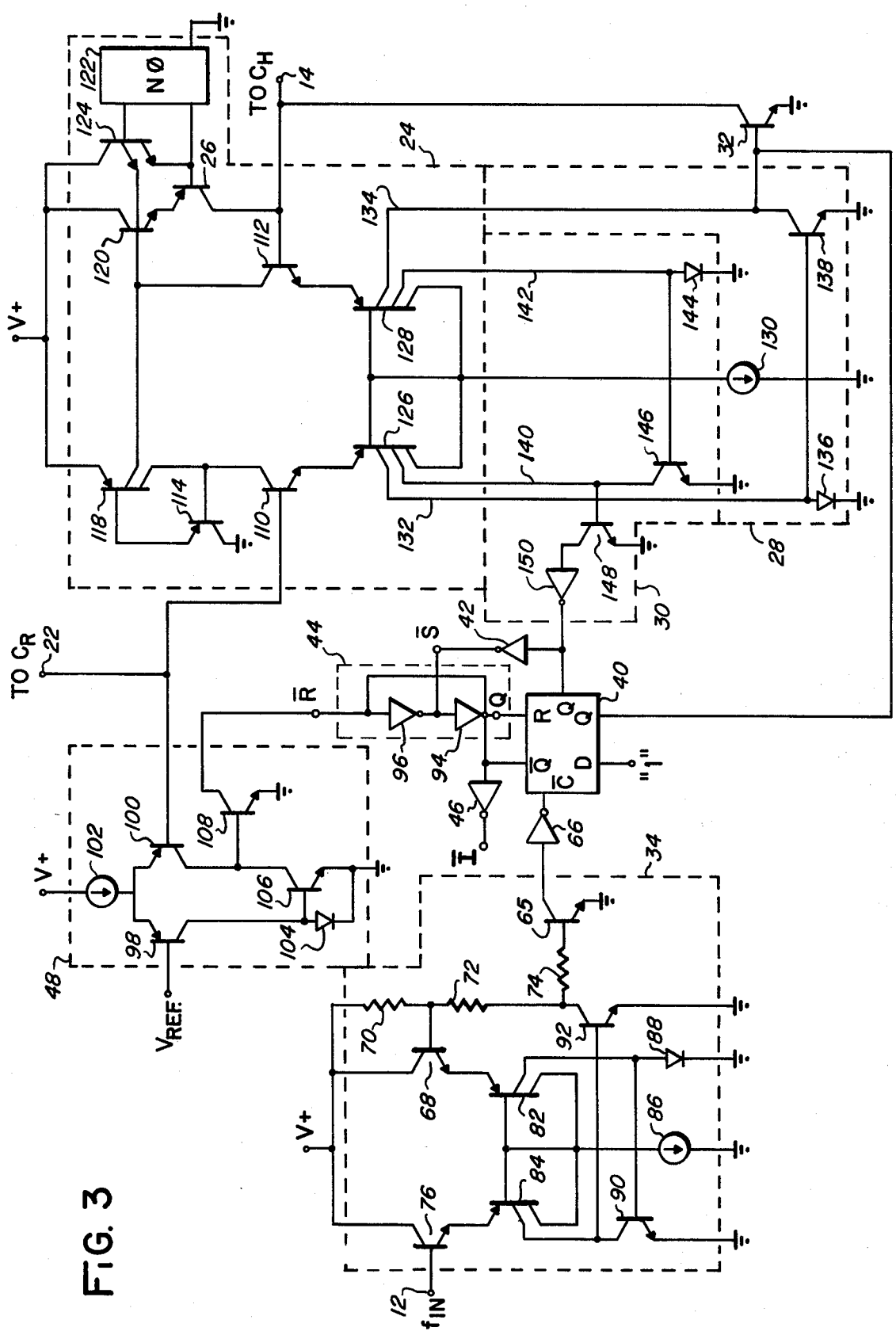
FIG. 3 is a schematic diagram of the preferred embodiment of the invention.

Turning now to FIG. 3, a preferred embodiment of frequency to converter 10 is shown in greater detail in schematic diagram form. The circuits illustrated in FIG. 3 which correspond to the functional block diagram circuits of FIG. 1 are indicated by corresponding like numbers. Additionally, it is understood that all of the logic circuitry shown in FIG. 3 is fabricated using I²L techniques.

Input operational amplifier 34 functions as a comparator circuit with hysteresis. The operation of operational amplifier 34 as a comparator is described in detail in the aforementioned application entitled "Comparison Circuit Having Bidirectional Hysteresis" and is incorporated herein by reference and will only be briefly explained hereinafter. With $f_{IN}$ in a low state, transistor 65 is maintained in a saturated state thereby causing a logic "1" to be applied to the $\overline{C}$ input of D flip-flop 40 via inverter 66. With transistor 65 in a saturated state, a bias potential is maintained at the base of transistor 68 which is established through the resistor divider network consisting of resistors 70, 72 and 74. Therefore, with $f_{IN}$ in its low state, 76 sources current to the emitter of transistor 82. Transistors 82 and 84 being matched, multi-collector transistors, produce switching currents determined by current source 86 at respective output collectors thereof. Diode 88 and transistor 90 comprise a current mirror circuit such that in the aforedescribed condition transistor 90 is nonconductive. In this state, there is no excess base current which can be provided to transistor 92 and hence this transistor is maintained in an off or nonconductive state. Transistor 65 is therefore rendered conductive and is in a saturated state. In response to the leading edge of input signal $f_{IN}$ going positive, transistor 76 is rendered more conductive than transistor 68. This condition creates an excess current through the collector of transistor 84 which is utilized as base current drive to transistor 92 thereby rendering it conductive. Transistor 92 becoming conductive renders transistor 65 nonconductive thereby causing the output of inverter 66 to go negative as shown by waveform 52. Resistor 74 is then shorted to ground through the collector-emitter path of transistor 92 causing the bias potential at the base of transistor 68 to decrease establishing hysteresis in the comparator. Therefore, in response to $f_{IN}$ going positive, a negative going transition at the output of inverter 66 is created to provide the trigger function to D flip-flop 40 as described above.

When D flip-flop 40 is triggered the Q output goes high and is applied to the input of NAND gate 42 which is shown schematically as an inverter circuit which requires both the output from D flip-flop 40 and the output from op amp 30 to be high to gate a logic "0" at its output terminal. As previously discussed, if $V_{CH}$ is within a predetermined range of the magnitude of $V_{CR}$ the output from op amp 30 will be at a logic "1" and therefore when D flip-flop 40 is triggered, a logic "0" is gated at the output of NAND gate 42 to the $\overline{S}$ terminal of RS latch 44. As shown, RS latch 44 comprises two I²L serially coupled inverter circuits with the output of inverter 94 being fed back to the input of inverter 96. Therefore, with a logic "0" applied to the $\overline{S}$ input of RS latch 44 the Q output thereof is gated to a logic "1", as stated above, which resets D flip-flop 40 causing the $\overline{Q}$ output thereof to also go to a logic "1". Hence, with both the Q output of RS latch 44 and the $\overline{Q}$ output of D flip-flop 40 high, NAND gate 46, shown as an inverter, acts in the same manner as inverter or NAND gate 42 and gates a logic "0" to its output terminal thereof indicated by $\overline{I}$. Hence, as shown in FIG. 2, waveform 54, $\overline{I}$ is in a low state. With $\overline{I}$ in a low state, capacitor $C_R$ is discharged as shown by waveform 56.

The output from capacitor $C_R$ is applied to terminal 22 to comparator amplifier 48 which is utilized to reset RS latch 44 when capacitor $C_R$ is discharged to a magnitude less than the voltage, $V_{REF}$, which is applied to comparator 48. For instance, with the magnitude of $V_{CR}$ greater than that of $V_{REF}$, transistor 98 is rendered more conductive than transistor 100 (both of which are supplied with emitter current from current source 102). Diode 104 is thus rendered conductive and transistor 106 becomes saturated to render transistor 108 nonconductive. However, when $V_{CR}$ is less than $V_{REF}$, transistor 100 conducts more heavily than transistor 98 such that an excess current is provided to the base of transistor 108 rendering it conductive to reset RS latch 44.

Op amp 24 in conjunction with capacitor $C_H$ provides the peak detecting function as discussed above. The operation of amplifier 24 is discussed in detail in the aforementioned application entitled "High Impedance Output Current Source" which is assigned to Motorola, Inc. and is incorporated herein by reference. Briefly, if the magnitude of $V_{CH}$ appearing at terminal 14 is equal to or greater than the magnitude of $V_{CR}$ which is applied to the input of op amp 24, transistors 110, 114, 118, 120 and 126 will be nonconducting. (However, a slight leakage current is produced through the base emitter junction of transistor 112 and capacitor $C_H$ is slightly discharged as is shown in waveform 64 but which does not affect the operation of the circuit.) If $V_{CR}$ reaches a peak value greater than the magnitude of $V_{CH}$, transistor 110 is rendered conductive which renders both transistors 114 and 118 conductive. With transistor 118 conductive collector current is sourced to both transistor 110 and 112 as well as base current drive to transistor 120. As transistor 120 conducts transistor 26 will be rendered conductive to provide a high impedance source of current to capacitor $C_H$ to charge the same to the peak value of the voltage $V_{CR}$. N$\phi$ circuit 122 is utilized in conjunction with transistor 124 to establish a predetermined bias to transistors 120 and 26 respectively. The output of operational amplifier 24 is provided at the output of the collector electrode of transistor 26 and is fed back to the input of the op amp (the base electrode of transistor 112) to establish unity gain through the amplifier such that the magnitude of voltage appearing at the base of transistor 112 is substantially equal to the magnitude of the voltage applied to the base electrode of transistor 110. The conductive path for transistors 110 and 112 are through their respective emitter connections to multi-collector transistors 126 and 128. These latter transistors have a respective collector and their base electrodes thereof connected to current source 130.

Operational amplifier 28 comprises transistors 126 and 128 via their output collector electrodes 132 and 134 respectively as well as diode 136 and transistor 138. Additionally, operational amplifier 30 is shown as sharing collectors 140 and 142 of transistors 126 and 128 respectively. The operation of amplifiers 28 and 30 is explained in detail in the application entitled "Switching Circuit Having Hysteresis" which is assigned to Motorola, Inc. and is incorporated by reference herein. Briefly, as long as the current through collector 132 is greater than the current through collector 134, diode 136 is conductive and transistor 138 is maintained in a saturated state to bias transistor 32 nonconductive. Hence, capacitor $C_H$ cannot be discharged. If, however, $V_{CH}$ is greater than $V_{CR}$, when the Q output of flip-flop 40 is clocked high, excess base current is supplied to transistor 32 from transistor 38 rendering transistor 32 conductive. This causes capacitor $C_H$ to be discharged as previously described.

Operational amplifier 30 operates in essentially the same fashion as amplifier 28 except that the area of the PN junction of diode 144 is made larger than the area of the base to emitter regions of transistor 146 such that an offset voltage shown as $V_{OFFSET}$ is established. For instance, if the area of the PN junction of diode 144 is made twice the area of the base-emitter region of transistor 146 an offset of 36 millivolts is required before the transistor 146 is rendered conductive. Thus, as long as the magnitude of $V_{CH}$ is greater than the value the magnitude of $V_{CR}$ plus 36 millivolts, base drive is supplied to transistor 146 to render it conductive. With transistor 146 conductive transistor 148 will be rendered nonconductive forcing a logic "0" at the output of inverter 150. If, however, the magnitude of $V_{CH}$ is equal to or less than $V_{CR}+36$ millivolts transistor 146 is off and transistor 148 is in an on state which forces a logic "1" at the output of inverter 150. Hence, as previously discussed, in response to the triggering of D flip-flop 40, the output of NAND gate 42 is forced low.

What has been described therefore is a frequency to voltage converter wherein the magnitude of the voltage at the output of said converter is made proportional to the frequency of the input signal applied to the converter. In the preferred embodiment described above, the output analog voltage is made proportional to the inverse of the frequency of the input signal applied thereto. It is contemplated that the frequency to voltage converter of the present invention may be utilized in a control system such as a fuel metering system for an automobile whereby the ratio of air to fuel can be controlled to ensure proper mixture thereof in the operation of the engine for the automobile.

What is claimed is:

1. Frequency to voltage converter for producing an output analog voltage proportional to the frequency of an alternating input signal, comprising:
   first circuit means for generating an output signal having a variable peak magnitude, said variable peak magnitude of said output signal being controllable;
   peak detector means receiving said output signal from said first circuit means for producing an analog voltage having a magnitude which is representative of the peak magnitude of said output signal from said first circuit means; and
   second circuit means responsive to the alternating input signal being applied thereto for causing said peak magnitude of said output signal from said first circuit means to be varied proportionately with variations in the frequency of the applied alternating input signal such that said peak magnitude is representative of the frequency of the input signal.

2. The frequency to voltage converter of claim 1 wherein said first circuit means includes:
   first constant current source means for providing a current of a first predetermined magnitude;
   second constant current source means for providing a current of a second predetermined magnitude;
   switch means coupled between said first and second constant current source means; and
   charge storage means coupled to said first constant current source means and to said switch means such that said charge storage means is charged at a rate proportional to said first constant current source means when said switch means is in an open state and is discharged at a second constant rate when said switch means is in a closed state, said charge storage means being coupled to an output of said first circuit means.

3. The frequency to voltage converter of claim 2 wherein said peak detecting means includes:
   a unity gain amplifier having an input coupled to said output of said first circuit means and an output terminal; and
   second charge storage means coupled to said output of said unity gain amplifier means wherein said second charge storage means is charged by said unity gain amplifier whenever the voltage developed across said second charge storage means is less than the magnitude of the voltage developed across said charge storage means of said first circuit means.

4. The frequency to voltage converter of claim 3 wherein said second circuit means includes:
   first comparator means having an input coupled to the input of the frequency to voltage converter for receiving said alternating input signal and an output terminal, said comparator means being responsive to the positive going transition of the alternating signal for producing a triggering signal at said output thereof;
   second comparator means for comparing the magnitude of the voltages developed across said charge storage means of said first circuit means and said second charge storage means respectively for producing an output signal therefrom the level of which is representative of the respective voltages appearing across said charge storage means of said first circuit means and said second charge storage means; and
   logic gating means coupled between said first and second comparator means and said switch means which is responsive to said triggering signal and said output signal from said second comparator means for causing said switch means to be in an open and closed state accordingly.

* * * * *